(12) United States Patent
Huang

(10) Patent No.: US 6,877,994 B2
(45) Date of Patent: Apr. 12, 2005

(54) ELECTRONIC DEVICE HAVING A USB CONNECTOR

(75) Inventor: Chien-Chung Huang, Taipei Hsien (TW)

(73) Assignee: Apacer Technology, Taipei Hsien (TW)

( * ) Notice: Subject to any disclaimer, the term of this patent is extended or adjusted under 35 U.S.C. 154(b) by 0 days.

(21) Appl. No.: 10/643,880

(22) Filed: Aug. 20, 2003

(65) Prior Publication Data

US 2004/0102093 A1 May 27, 2004

(30) Foreign Application Priority Data

Oct. 24, 2002 (TW) ........................................ 91124769 A

(51) Int. Cl.⁷ .............................................. H01R 12/00
(52) U.S. Cl. ..................................... 439/76.1; 439/607
(58) Field of Search ................................ 439/76.1, 607

(56) References Cited

U.S. PATENT DOCUMENTS

| | | | | |
|---|---|---|---|---|
| 6,456,500 B1 | * | 9/2002 | Chen ........................... | 361/752 |
| 6,554,648 B2 | * | 4/2003 | Shi et al. ..................... | 439/607 |
| 6,575,772 B1 | * | 6/2003 | Soubh et al. ............... | 439/76.1 |
| 6,736,678 B2 | * | 5/2004 | Yao ............................. | 439/638 |
| 6,744,634 B2 | * | 6/2004 | Yen ............................. | 361/752 |

* cited by examiner

*Primary Examiner*—Ross Gushi
(74) *Attorney, Agent, or Firm*—Michael Bednarek; Shaw Pittman., LLP

(57) ABSTRACT

An electronic device having a USB connector is proposed and includes a circuit board and a USB connector mounted on the circuit board, wherein the USB connector includes a body portion, at least one contact pad, and a frame, in which the body portion is integrally formed on the circuit board and the contact pad is formed on the body portion, and the frame is attached to the body portion and mounted on the circuit board in a manner of surrounding the body portion.

16 Claims, 7 Drawing Sheets

ELECTRONIC DEVICE HAVING A USB CONNECTOR

FIELD OF THE INVENTION

The present invention is related to an electronic device having a USB connector, and more particularly to an electronic device having a USB connector with a miniaturized size and cost-effective economic benefits.

BACKGROUND OF THE INVENTION

A universal serial bus (USB) connector is well known in the art due to its high expandability and hot swappable capability. USB connector is able to provide a standard and inexpensive way to connect a peripheral device with a computer host. As a result, USB connector has become the foremost selection in the design of connector to be arranged on a peripheral device.

The structure of a conventional USB connector 40 is shown in FIGS. 1a and 1b. Generally the USB connector 40 is arranged on an electronic device 20 serving as a peripheral device and is able to allow a USB socket 30 that is normally arranged on another peripheral device 10 to be plugged in.

Referring to FIGS. 1b and 1c, wherein FIG. 1c is a front view of the USB connector 40 of FIG. 1b. As can be seen from this figure, the USB connector 40 includes a plastic seat 41, four metal contacts 42 and a frame 43, wherein the metal contacts 42 are inset into the plastic seat 41 and the plastic seat 41 is surrounded with the frame 43. Two securing holes 431 are formed on a top surface of the frame 43, and two fastening portions 432 are formed on a bottom surface of the frame 43. The circuit board 21 is further provided with four first perforations 211 and two second perforations 212 for allowing the metal contacts 42 and fastening portions 432 to be inserted therein respectively, in order to secure the USB connector 40 to the circuit board 21 by solder pads.

Please refer to FIGS. 1b and 1d. FIG. 1d is a front view of the USB socket 30 of FIG. 1b. The USB socket 30 is also provided with a plastic seat 31, four metal contacts 32 and a frame 33, wherein the metal contacts 32 are placed onto the plastic seat 31 and the plastic seat 31 is surrounded with the frame 33, and the frame 33 is further provided with two securing pieces 331. It is to be noted that the metal contacts 32 is placed onto the plastic seat 31 in the form of elastic pieces and protrude from a surface of the plastic seat 31 rather than being clung closely to the surface of the plastic seat 31, as shown in FIG. 1d. In this manner, the metal contacts 41 and 31 can be solidly abutted with each other as the USB connector 40 and the USB socket 30 are coupled together.

The constitution of a prior art USB connector has been described in detail as above. However, because the prior art USB connector has to be mounted on a circuit board, solder pads are necessary for securing the prior art USB connector to a circuit board during the manufacturing process of a USB connector. This manufacturing step will additionally burden the electronic device manufacturing process using surface-mounting technique (SMT).

Also, the prior art USB connector is necessary to be electrically engaged with a circuit board through metal contacts, and thus additional space is required on the circuit board. However, such a configuration will transgress the current trend of USB connector development which is focused on a small and thin shape.

More disadvantageously, the metal contacts are used to transmit electric signals between the USB connector and the circuit board. In high speed signal transmission, an incompatibility problem will be generated due to an imperfect impedance matching between the circuit board and metal contacts.

SUMMARY OF THE INVENTION

To cope with the foregoing unfavorable drawbacks, the present invention provides an electronic device having a USB connector with a miniaturized size and a reduced cost.

According to the present invention, an electronic device having a USB connector is addressed and includes a circuit board and a USB connector, wherein the USB connector is arranged on the circuit board and includes a body portion, at least one contact pad, and a frame. The body portion is integrally formed on the circuit board and the contact pad is mounted on the body portion, whereas the frame is attached to the body portion and mounted on the circuit board.

In a preferred embodiment, the frame is secured onto the body portion in such a manner of surrounding the body portion.

It is easily understood that the frame is made of metal and the contact pad is formed from copper foil.

In another preferred embodiment, the electronic device further includes a fastening portion positioned between the frame and the body portion for attaching the frame to the body portion.

It is preferably that the fastening portion is accomplished with a solder pad.

In another preferred embodiment, the circuit board is further provided with a concaving portion located in the proximity of the body portion, and the frame is provided with a projecting portion which is formed in a lower end of the frame in opposition to the concaving portion. The frame is mounted on the circuit board by mating the projecting portion with the concaving portion.

The electronic device is further provided with a connecting portion located in the proximity of concaving portion and the projecting portion for attaching the frame to the body portion.

A further aspect of the present invention is made by the provision of a USB connector for use in an electronic device, wherein the electronic device includes a circuit board and the USB connector includes a body portion, a contact pad, and a frame. The body portion is integrally formed on the circuit board and the contact pad is formed on the body portion, and the frame is attached to the body portion and mounted on the circuit board.

The feature and advantages of the present invention can be made obvious to those of skilled in the art by the following detailed descriptions of preferred embodiment with reference to the drawings accompanied therewith, in which:

DETAILED DESCRIPTION OF THE PREFERRED EMBODIMENTS

Figure 1A:
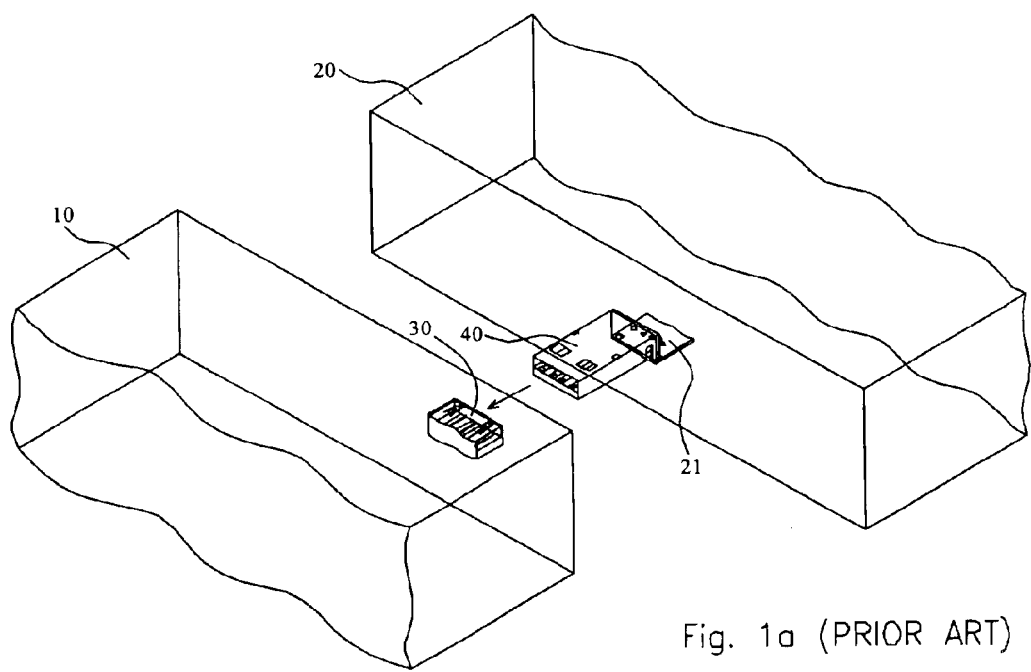
FIG. 1a is a schematic view of an electronic device having a USB connector and a USB socket according to the prior art.
Figure 2A:
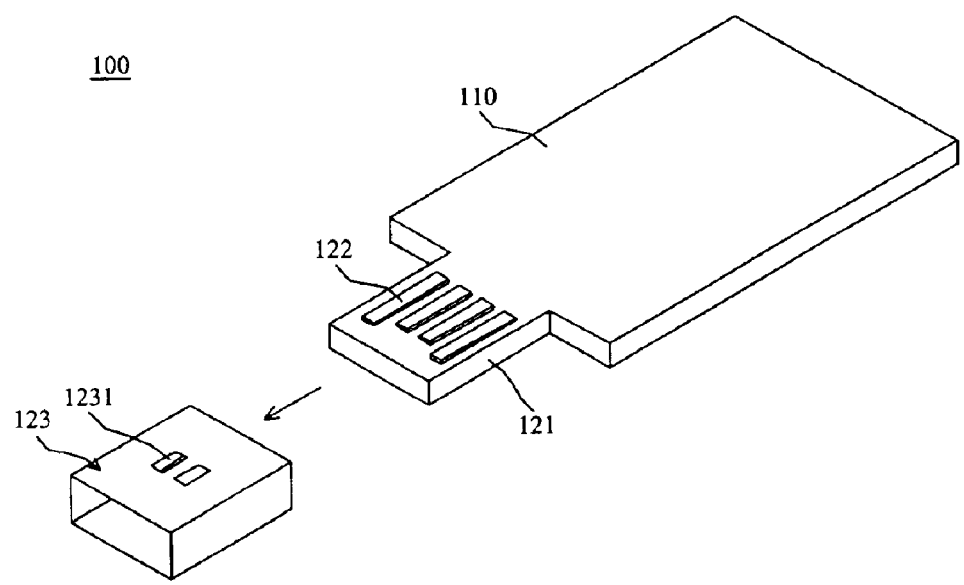
FIG. 2a is an exploded view of an electronic device having a USB connector according to the present invention.
Figure 2B:
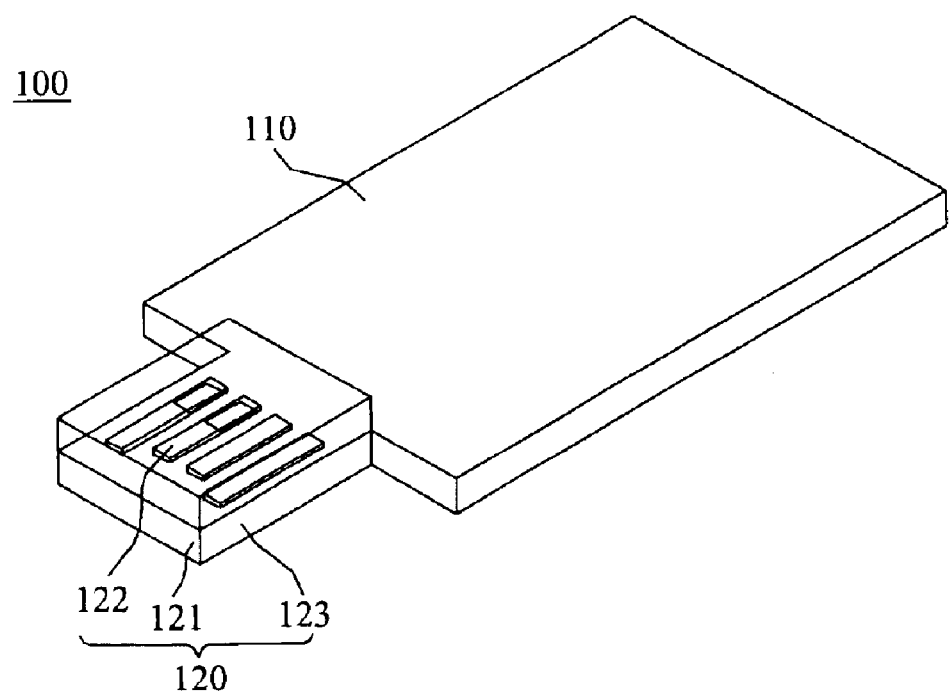
FIG. 2b is an assembled view of an electronic device having a USB connector according to the present invention.

Referring to FIGS. 2a and 2b which show a preferred embodiment of an electronic device having a USB connector according to the present invention. In this preferred embodiment, the electronic device 100 includes a circuit board 110 and a USB connector 120. It should be noted that the electronic device 100 is supposed to include other components such as a casing, as is the case of the electronic device shown in FIG. 1a. However, for the purpose of description, other components of the electronic device 100 that is irrelevant to the present invention are omitted for simplification.

The circuit board 100 is made by a printed circuit board that is generally mounted inside the electronic device 100, and a USB connector 120 is arranged on the circuit board. Broadly speaking, USB connector 120 includes a body portion 121, four contact pads 122, and a frame 123, wherein the body portion 121 is integrally formed on the circuit board 110 in a shape of a protrusion of the circuit board 110, and the contact pads 122 are manufactured by copper foil and formed on the body portion 121. That is, the contact pads 122 can be formed on the surface of the body portion 121 at the time the printing process for manufacturing the circuit board 110 is in progress, and couple with the desired electronic circuits on the circuit board 110.

The frame 123 is attached to the body portion 121 and surrounds the body portion 121 as shown in FIG. 2b. It should be understood that the frame 123 is formed from metal.

Figure 3A:
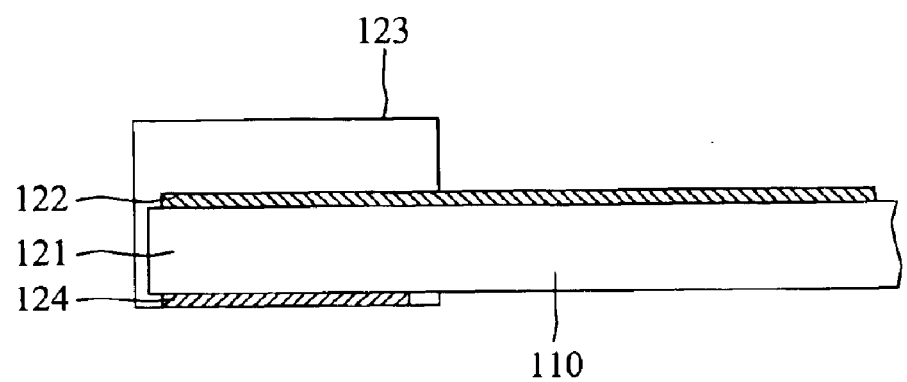
FIG. 3a is a plan view showing a modified example of an electronic device having a USB connector according to the present invention.

Referring to FIG. 3a which shows a modified example of the electronic device having a USB connector according to the principle of the present invention. As shown in FIG. 3a, in order to securely attach the frame 123 to the body portion 121, the electronic device 100 can further include a coupling portion 124 arranged between the frame 123 and the body portion 121 and can be implemented with a solder pad. In this way, the frame 123 can be securely attached to the body portion 121 by the coupling portion 124 during the manufacturing process of the electronic device involving the surface mounting (SMT) step and other accessorial steps.

Figure 3B:
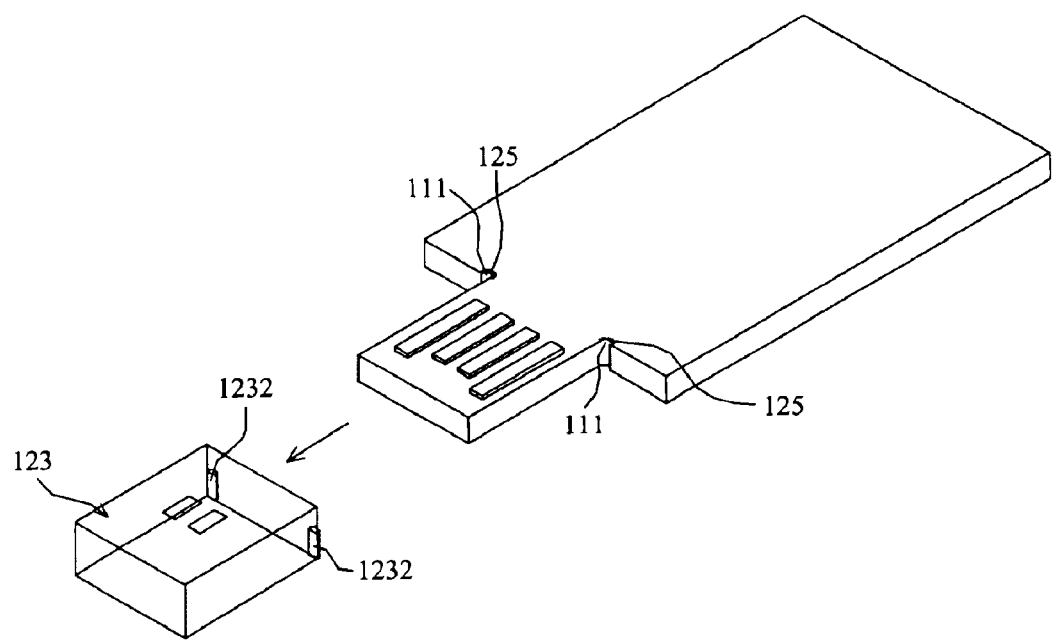
FIG. 3b is a plan view showing another modified example of an electronic device having a USB connector according to the present invention.

It is to be noted that the manner of attaching the frame 123 to the body portion 121 are not restrictedly limited to the form as discussed in the above. For example, referring to FIG. 3b which shows an alternative example of the electronic device having a USB connector according to the principle of the present invention, in which two concaving portions 111 are formed on the circuit board 110 in the proximity of the body portion 121 and two projecting portions 1232 are formed in the lower end of the frame 123 being respectively opposite to the concaving portions 111. As a result, when it is desired to attach the frame 123 to the body portion 121, the projecting portions 1232 can be respectively fitted with the concaving portions 111, and connecting portions 125 formed of solder pads can be arranged in the proximity of the concaving portions 111 and the projecting portions 1232. This can ensure a secure attachment between the frame 123 and body portion 121 by the interconnection among the connecting portions 125, the projecting portions 123 and the concaving portions 111 when the manufacturing of the electronic device is in the process of surface mounting (SMT) step and other accessorial steps.

Figure 1B:
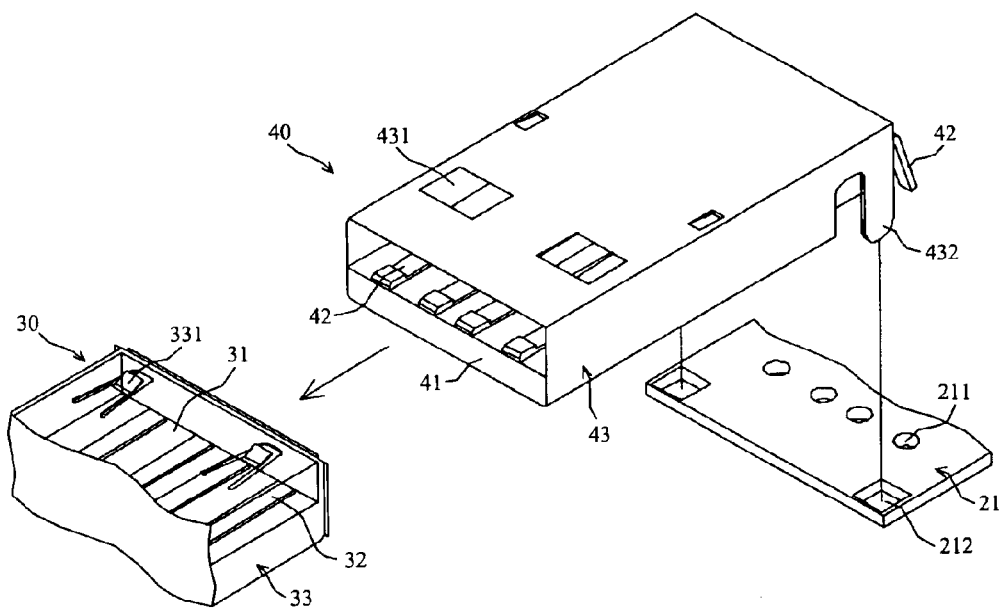
FIG. 1b is an exploded view illustrating a USB connector and a USB socket of FIG. 1a according to the prior art.
Figure 1C:
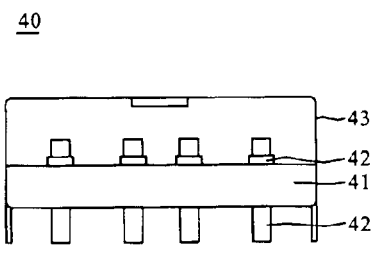
FIG. 1c is a front view of the USB connector of FIG. 1b.
Figure 1D:
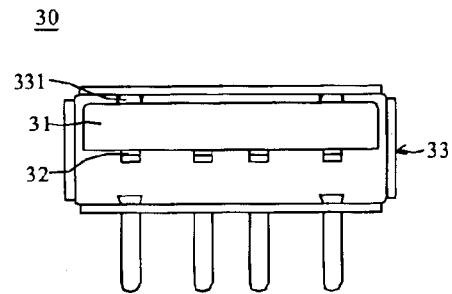
FIG. 1d is a front view of the USB socket of FIG. 1b.

Referring to FIG. 2a again, two securing holes 1231 can be made on the top surface of the frame 123 to mate with the fastening pieces 331 on the USB socket 30 (see FIG. 1b) when the USB connector 120 is coupled with the USB socket 30.

As stated above, the body portion of the USB connector according to the principle of the present invention is integrally formed on the circuit board, and the USB connector formed thereby uses contact pads formed in situ on the body portion in place of prior art metal contacts. Since the plastic seat and metal contacts used in the prior art USB connector are eliminated according to the present invention, the total thickness and manufacturing cost of the USB connector can be reduced greatly, and the impedance matching problems arising between the USB connector and the circuit board can be suppressed.

Advantageously, because the metal contacts are replaced with the contact pads formed in situ on the circuit board, the interconnection between the metal contacts and the circuit board can be eliminated. Therefore the whole length of the USB connector can be shortened and the size of the USB connector according to the present invention can be miniaturized.

More advantageously, when signals are to be transmitted between the USB connector and the circuit board, an intermediate medium that is supposed to be coexisted with the signal transmission path during signal transmission is vanished due to the removal of the metal contacts. The impedance matching problems appearing between the USB connector and the circuit board can be tackled, and the incompatibility generated during high speed signal transmission can be addressed.

Although the present invention has been described and illustrated in detail, it is to be clearly understood that the same is by the way of illustration and example only and is not to be taken by way of limitation, the spirit and scope of the present invention being limited only by the terms of the appended claims.

What is claimed is:

1. An electronic device having a USB connector comprising:

a circuit board; and

USB connector mounted on the circuit board;

wherein the USB connector comprising:

a body portion integrally formed on the circuit board;

at least one contact pad arranged on the body portion;

a frame attached to the body portion and mounted on the circuit board; and a fastening portion comprising a solder pad and arranged between the frame and the body for attaching the frame to the body portion.

2. The electronic device of claim 1 wherein the body portion is surrounded with the frame.

3. The electronic device of claim 1 wherein the frame is formed from metal.

4. The electronic device of claim 1 wherein the contact pad is formed from copper foil.

5. The electronic device of claim 1 wherein a concaving portion is formed in the proximity of the body portion, and a projecting portion is formed on the frame in opposition to the concaving portion, and wherein the frame is mounted on the circuit board by mating the projecting portion with the concaving portion.

6. The electronic device of claim 5 further comprising a connecting portion positioned in the proximity of the concaving portion and the projecting portion for securing the frame to the circuit board.

7. The electronic device of claim 6 wherein the connecting portion comprises a solder pad.

8. A USB connector for an electronic device having a circuit board therein, the USB connector comprising:

a body portion integrally formed on the circuit board;

a coupling pad arranged on the body portion; and a frame attached to the coupling pad and mounted on the body portion.

9. The USB connector of claim 8 the body portion is surrounded with the frame.

10. The USB connector of claim 8 wherein the frame is formed from a metal.

11. The USB connector of claim 8 wherein the contact pad is formed from copper foil.

12. The USB connector of claim 8 further comprising a fastening portion arranged between the frame and the body for attaching the frame to the body portion.

13. The USB connector of claim 12 wherein the fastening portion is formed from a solder pad.

14. The USB connector of claim 8 wherein a concaving portion is formed in the proximity of the body portion, and a projecting portion is formed on the frame in opposition to the concaving portion, and wherein the frame is mounted on the circuit board by mating the projecting portion with the concaving portion.

15. The electronic device of claim 14 further comprising a connecting portion positioned in the proximity of the concaving portion and the projecting portion for securing the frame to the circuit board.

16. The electronic device of claim 15 wherein the connecting portion comprises a solder pad.

* * * * *